United States Patent [19]

Morioka et al.

[11] Patent Number: 4,783,235

[45] Date of Patent: Nov. 8, 1988

[54] METHOD FOR GROWING A SINGLE CRYSTAL OF COMPOUND SEMICONDUCTOR

[75] Inventors: Mikio Morioka; Atsushi Shimizu, both of Hyogo, Japan

[73] Assignee: Sumitomo Electric Industries, Ltd., Osaka, Japan

[21] Appl. No.: 11,428

[22] Filed: Feb. 3, 1987

Related U.S. Application Data

[63] Continuation of Ser. No. 748,559, Jun. 25, 1985, abandoned.

[30] Foreign Application Priority Data

Jul. 20, 1984 [JP]  Japan ................. 59-150900

[51] Int. Cl.[4] .................... C30B 15/22; C30B 29/42
[52] U.S. Cl. ................ 156/620.2; 156/617.1; 156/605; 156/DIG. 70
[58] Field of Search ........... 156/607, 617 SP, 601, 156/605, 617.1, 620.2

[56] References Cited

U.S. PATENT DOCUMENTS

| | | | |
|---|---|---|---|
| 3,496,118 | 2/1970 | Williardson | 252/62.3 |
| 3,741,817 | 6/1973 | Binert et al. | 156/607 |
| 4,282,184 | 8/1981 | Fiegl et al. | 156/DIG. 83 |
| 4,417,943 | 11/1983 | Jacques et al. | 156/617 SP |
| 4,478,675 | 10/1984 | Akai | 756/607 |
| 4,537,652 | 8/1985 | Kawasaki et al. | 156/617 SP |
| 4,659,421 | 4/1987 | Jewett | 156/617 SP |

FOREIGN PATENT DOCUMENTS

131597  7/1984  Japan ............................. 156/607

OTHER PUBLICATIONS

Journal of Crystal Growth 52 (1981) 396–403, Effect of Doping on Formation of Dislocation Structure in Semiconductor Crystals, M. G. Mil'Vidsky et al., pp. 396–403.

Journal of Crystal Growth 61 (1983) Dislocation-Free GaAs and InP Crystals by Isoelectronic Doping, G. Jacob et al., pp. 417–424.

Buehler et al., "Procede pour la production de cristaux, notamment de germanium," FR-A-1 029 684, 9/12/55.

Fukudo et al., "Growth and Electrical Properties of Gallium Arsenide Single Crystal", J. Journal of Applied Physics, 1983, pp. 153–156.

*Primary Examiner*—Gary P. Straub
*Attorney, Agent, or Firm*—Cushman, Darby & Cushman

[57] ABSTRACT

An improvement of LEC methods. Highly impurity doped single crystal often suffers from impurity precipitation. The cause of the occurrence of impurity precipitation is supposed to be the supercooling. To avoid the occurrence of supercooling the pulling speed is slowly lowered during the crystal growth in the LEC methods. The beginning of the occurrence of impurity precipitation is delayed by lowering the pulling speed. Additional application of magnetic field is more effective.

5 Claims, 3 Drawing Sheets

METHOD FOR GROWING A SINGLE CRYSTAL OF COMPOUND SEMICONDUCTOR

This is a continuation of application Ser. No. 748,559, filed June 25, 1985, which was abandoned upon the filing hereof.

BACKGROUND OF THE INVENTION

This invention relates to an improvement of a method for growing a single crystal of compound semiconductor.

Compound semiconductor has various kind of compositions—GaAs, InP, InAs, GaP, InSb, etc. Among the components the element of group V has a high dissociation pressure. It is difficult to grow a stoichiometric single crystal because of this high dissociation pressure of the element of group V.

An LEC (Liquid Encapsulated Czochralski) method is one of most preferable methods for growing a single crystal of compound semiconductor. The LEC method has advantages that circular wafers are easily obtained and semi-insulating GaAs single crystal is grown without doping Cr etc. It is an excellent method from the industrial viewpoint.

The LEC method has many improved variations. However there are some inherent disadvantages in conventional LEC methods.

In all LEC methods a single crystal is pulled up using a seed crystal from a melt of compound semiconductor covered with a liquid encapsulant under an inactive gas pressurized at several atm to several tens atm to prevent the element of group V from escaping.

When the single crystal emerges from the liquid incapsulant, it is rapidly cooled by a vehement convection of inactive gas above the liquid encapsulant. Strong thermal stresses occur in the rapidly cooled crystal, which result in many lattice defects in the crystal.

An ingot grown by the LEC method is sliced into many thin wafers. The wafers are etched. Then etch pit density (EPD) is measured. The EPD of the wafers sliced from the LEC-grown crystal is about 10,000/cm$^2$ to 100,000/cm$^2$.

Many improvements of LEC methods have been proposed to overcome the disadvantages of conventional LEC methods.

One proposal is an idea of preventing the generation of strong temperature gradients in a cooling single crystal. For this purpose the cooling by the convection of the inactive gas must be suppressed.

To suppress the cooling, the thick liquid encapsulant seems to be effective. Namely instead in gas a single crystal is slowly cooled in a thick liquid encapsulant instead of an inactive gas. The liquid encapsulant plays a role as heat-insulator. However this method consumes great amount of liquid encapsulant. Because the single crystal rotates in the liquid encapsulant with a high viscosity, it is difficult to control the diameter of single crystal. Although this proposal is able to be put into practice, it has these disadvantages.

Another proposal is to alleviate the temperature gradients by using plural heaters. This improvement may be called "multi-heater method". More than two heaters and heat-insulators are installed along a vertical direction to alleviate the vertical temperature gradient. Rising in a moderate temperature gradient, a single crystal is slowly cooled. The purpose of the improvement is to heighten the thermal uniformity in the space above the liquid encapsulant.

Third proposal is an idea of doping isoelectronic impurities. Isoelectronic impurity is one which has the electronic property same as the component elements of crystal. In the case of III-V compound semiconductor, isoelectronic impurity is one of the element of groups III and V other than the components of the base compound.

For example, In, B, Sb, Al, P etc., are isoelectronic impurities for GaAs.

If some isoelectronic impurities are doped with more than 10$^{18}$ atoms/cm$^3$, the EPD of the doped crystal is reduced to a great extent. Doping of other isoelectronic impurities are of no use.

For example for GaAs single crystal, the isoelectronic impurities In, Sb and B are effective to reduce the EPD.

However the reason why the isoelectronic impurities reduce EPD has not been clearly explained yet.

Distribution coefficient is defined as a quotient of an impurity concentration in solid divided by an impurity concentration in liquid or melt when the solid phase and the liquid phase are in equilibrium.

For example, the distributiion coefficient of In in GaAs is 0.1 to 0.15.

To dope In to a crystal, the GaAs melt from which the crystal is pulled must include In at six to ten times as much as the prescribed concentration in a crystal.

While a single crystal is pulled up from a melt including a high impurity concentration, the impurity concentration in the melt is increasing, if the distribution coefficient of the impurity is less than 1.

If In concentration is 5×10$^{18}$/cm$^3$ at the front portion of a GaAs crystal grown by an LEC method, In concentration would attain to higher values at middle portion or back portion of the crystal.

High impurity concentration brings about impurity precipitation. The portions including impurity precipitation cannot be used as substrates on which semiconductor devices are fabricated.

The improved 1EC method to dope an impurity to reduce EPD must face with the new difficulty-impurity precipitation.

If the impurity concentration in melt is high, impurity precipitation appears at an early stage. If the impurity concentration is low, EPD can not be reduced enough, although the beginning of precipitation delays.

Why does the impurity precipitation occur? This has not been solved yet.

The beginning of impurity precipitation depends not only on the impurity concentration in melt but also the pulling speed. Pulling speed is defined as a vertical speed of an upper shaft. The seed crystal as well as the growing crystal are pulled by the upper shaft. Then the pulling speed is equivalent to the growing speed in case of LEC methods.

In general the smaller pulling speed delays more the beginning of impurity precipitation.

The multi-heater method, one of improved LEC methods, cools a growing crystal in a quasi-uniform thermal environment with a very low temperature gradient to reduce thermal stress. However this improvement seems to advance the beginning of impurity precipitation.

Two improvements of LEC methods to reduce EPD—doping of isoelectronic impurity and cooling in low temperature gradient—make the impurity precipitation problem more serious.

As mentioned before, low pulling speed delays the beginning of precipitation. However if a single crystal was pulled up at a constant low speed, the crystal growth would take much long time. It is undesirable from an economical viewpoint.

Considering the fact that the beginning of precipitation depends not only on the impurity concentration but also on the temperature gradient and the pulling speed, this inventors suspected that the cause of impurity precipitation might be "supercooling".

When a liquid is cooled, it becomes a solid at a freezing point (melting point) in general. However if cooling rate is low enough, the liquid state is kept below the freezing point. This phenomenon is called supercooling.

The condition for occurrence of supercooling in a Czochralski method has been already considered.

The condition for occurrence of supercooling is given by $$G_l/R < (G_l/R)_c K_e \tag{1}$$

where $K_e$ is an effective distribution coefficient, $G_l$ is a temperature gradient in melt near a solid-liquid interface, and R is a growth rate (i.e. a pulling speed). The round bracket suffixed with c signifies a critical value of the bracket.

The critical value of $(G_l/R)$ is given by $$\left(\frac{G_l}{R}\right)_c = \frac{\Delta T(1-k)}{kD} \tag{2}$$

where k is an equilibrium distribution coefficient, $\Delta T$ is a decrement of melting point due to the impurity inclusion in melt and D is a diffusion constant.

The impurity concentration c varies according to the equation $$c = c_0(1-g)^{k-1} \tag{3}$$

where k is a distribution coefficient, g is a fraction solidified and $c_0$ is an initial impurity concentration in melt.

The effective distribution coefficient $K_e$ is given by $$K_e = \frac{k}{k + (1-k)\exp(-R\delta/D)} \tag{4}$$

where $\delta$ is a thickness of solute boundary layer. In equilibrium the thickness $\delta$ is zero. Although the rising single crystal is rotated to equalize the thermal environment near the solid-liquid interface, the melt and solid near the interface have transient thermal fluctuations.

In the case of Czochralski method the thickness is given by $$\delta(CZ) = 1.6D^{\frac{1}{3}}\nu^{1/6}\omega^{-\frac{1}{2}} \tag{5}$$

where $\nu$ is a dynamical viscosity of melt and $\omega$ is a relative angular velocity between the crystal and the crucible.

The decrement of the melting point is in proportion to the impurity concentration c in the melt. Then $\Delta T$ is written as $$\Delta T = mc \tag{6}$$

where m is a constant multiplier.

From Inequality (1), Eq. (2), Eq. (3) and Eq. (6), the condition for occurrence of supercooling is given by $$R > \frac{G_l k D(1-g)^{1-k}}{K_e(1-k)mc_0} \tag{7}$$

Hereafter the condition for occurrence of supercooling will be called as "supercooling condition" and the condition for non-occurrence of supercooling will be called as "non-supercooling condition" for simplicity.

If we assume $R\delta/D$ is much less enough than unity, the effective distribution coefficient $K_e$ is nearly equal to the equilibrium distribution coefficient k. Using this approximation, Eq. (7) can be written as $$R > \frac{G_l D(1-g)^{1-k}}{(1-k)mc_0} \tag{8}$$

In the case of LEC-growth of GaAs $$\nu \approx 4 \times 10^{-3} \text{ cm}^2/\text{sec}$$

$$D \approx 1 \times 10^{-4} \text{ cm}^2/\text{sec}$$

The rotation speed $\omega$ depends on various factors. If we assume the rotation speed of the upper shaft is +2 RPM and that of the lower shaft is −20 RPM, The relative rotation speed becomes 22 RPM. Then the angular velocity $\omega$ is calculated as $$\omega = 2.3/\text{sec}$$

Substituting these values into Eq. (5), we obtain $$\delta = 0.02 \text{ cm}$$

If the pulling speed is 10 mm/H, the value of $R\delta/D$ is roughly estimated as $$R\delta/D \approx 0.05$$

This is much less than unity. Therefore in the ordinary LEC method the effective distribution coefficient $K_e$ can be replaced by the equilibrium distribution coefficient k in Eq. (4).

Then Inequality (8) is a supercooling condition.

The decrement of the melting point can be expressed in terms of gram equivalence N, because the gram equivalence N is in proportion to the concentration.

In the case of GaAs melt, $$T = 360N \tag{9}$$

This relation is independent of the kind of impurity. Here we will consider the GaAs melt doped with In. The weight percent of In in GaAs melt is denoted by "w". The average atomic weight of GaAs is 72.3. The atomic weight of In is 114.82. Then the gram equivalence N is written as $$N = 0.63 \text{ w} \tag{10}$$

From Eq. (9) and Eq. (10), $\Delta T$ becomes $$\Delta T = 227 \text{ w} \tag{11}$$

The weight percent w is given by an equation similar to Eq. (3), in which $c_0$ is replaced by an initial gram equivalence $w_0$.

If we take $w_0$ and $G_l$ as explicit parameters, the supercooling condition is written as $$R > \frac{QG_l(1-g)^{1-k}}{w_0} \quad (12)$$

where $$Q = \frac{D}{227(1-k)} \quad (13)$$

The equilibrium distribution coefficient k of In in GaAs melt is approximately 0.1. The diffusion constant D was already given for In in GaAs melt. Using these values of k and D, the constant Q is calculated as $$Q = 4.88 \times 10^{-7} (cm^2/sec \cdot °C.)$$

If we assume $G_l = 50°$ C./cm and $w_0 = 0.015$ (1.5 wt%), the non-supercooling condition is given by $$R \leq 1.62 \times 10^{-3}(1-g)^{0.9} \text{ cm/sec} \quad (14)$$

For the pulling speed R, mm/H is more practical unit than cm/sec. In the practical unit of mm/H for R, the above condition is written as $$R \leq 58(1-g)^{0.9} \text{ mm/H} \quad (15)$$

Till now we will consider the supercooling condition with a typical example. Inequality (15) shows that the upper limit of pulling speed R is determined by the fraction solidified g.

Although the fraction solidified has a definite physical meaning, g is not always an observable variable. Then under some assumption optimum change of the pulling speed R will be considered.

From Inequality (12), the non-supercooling condition is given by $$R \leq QG_l w_0 (1-g)^{1-k} \quad (16)$$

Here the relation between the pulling time and the fraction solidified will be calculated.

The sectional area of a pulled single crystal, the density of the crystal and the initial weight of material melt are denoted by S, $\rho$ and W respectively. If the single crystal is pulled up at a constant speed $R_0$, the full length would be $W/\rho S$ at $g = 1$, in which all melt is solidified. The time required for pulling the single crystal is given by $W/\rho SR_0$.

Instead of a constant speed, we assume that the pulling speed R is changed as a function of fraction solidified. For example, we assume the following equation $$R = R_0(1-g)^{1-h} \quad (17)$$

where h is a constant of 0 to 1, and $R_0$ is an initial pulling speed.

The fraction solidified g satisfied the equation $$\frac{\rho S}{W} \int_0^t R\, dt = g \quad (18)$$

Differentiating Eq. (18) and substituting Eq. (17), we obtain a differential equation $$\frac{\rho S R_0 (1-g)^{1-h}}{W} = \frac{dg}{dt} \quad (19)$$

The solution is $$(1-g)^h = 1 - \frac{\rho S h R_0}{W} t \quad (20)$$

As mentioned before, h is a constant of 0 to 1. If h is equal to the upper limit $1(h=1)$, Eq. (20) would coincide with the ordinary pulling with a constant speed $R_0$.

As the value h becomes smaller, the total time for pulling up the single crystal increases in inverse proportion to h.

Substituting Eq. (20) into Eq. (17), we obtain the pulling speed R as a function of time t, $$R = R_0 \left(1 - \frac{\rho S h R_0 t}{W}\right)^{\frac{1-h}{h}} \quad (21)$$

SUMMARY OF THE INVENTION

A purpose of the invention is to provide an LEC method in which the occurrence of impurity precipitation is effectively suppressed despite high impurity concentration.

Another purpose of the invention is to provide an LEC method in which total pulling time is not so long as one in a constant pulling without impurity precipitation.

The other purpose of the invention is to provide an LEC method in which the occurrence of impurity precipitation is more effectively suppressed by heightening the temperature gradient in melt by a magnetic field.

DETAILED DESCRIPTION OF THE INVENTION

The improvement of this invention relates to the pulling speed of the growing crystal.

Instead of the constant pulling speed this invention changes the pulling speed to avoid the impurity precipitation.

Figure 1:
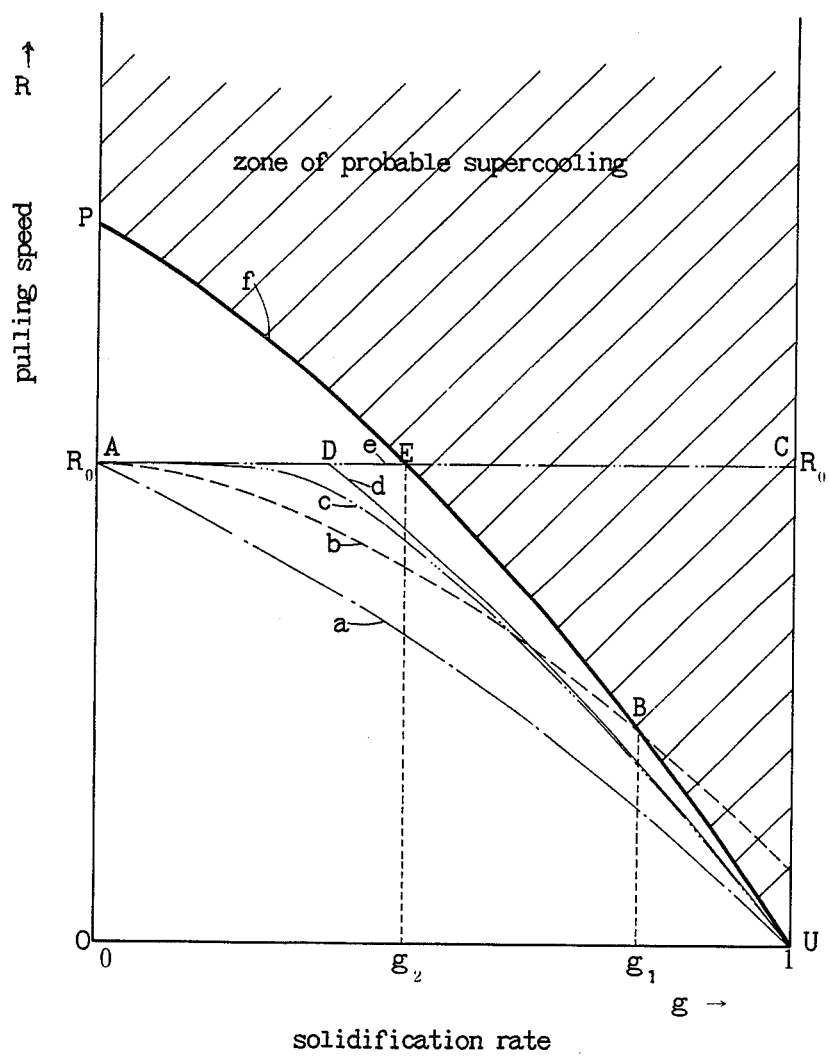
FIG. 1 is a graph showing the relations between the pulling speed R and the fraction solidified g.

FIG. 1 demonstrates the relation between the pulling speed R and the fraction solidified g. The abscissa denotes the fraction solidified g. The left original point O corresponds to $g=0$. The right and end point U corresponds to $g=1$. The ordinate shows the pulling speed R. The supercooling condition provided by Inequality (12) or (16) is shown with a curve PU in the graph. Hereafter the curve PU is called "supercooling curve" (suffixed with f) for simplicity. The hatched region above the curve f is a region where supercooling occurs.

Triangular region OPU below the supercooling curve f is the region where supercooling does not occur. It is desirable that the pulling speed should be taken in the "non-supercooling region" OPU.

In conventional LEC methods, the pulling speed R is constant. $R_0$ denotes a constant pulling speed. Then the relation between R and g is simply shown by the straight line AC in FIG. 1. The fraction solidified at the point E is denoted by $g_2$ where the straight line AC intersects the supercooling line f. In the conventional methods where the fraction solidified g exceeds $g_2$, the impurity precipitation happens.

Various pulling modes as a function of g are thought to be possible. The pulling mode represented by Eq. (17) to Eq. (21) corresponds to the curve a connecting A and U.

Figure 2:
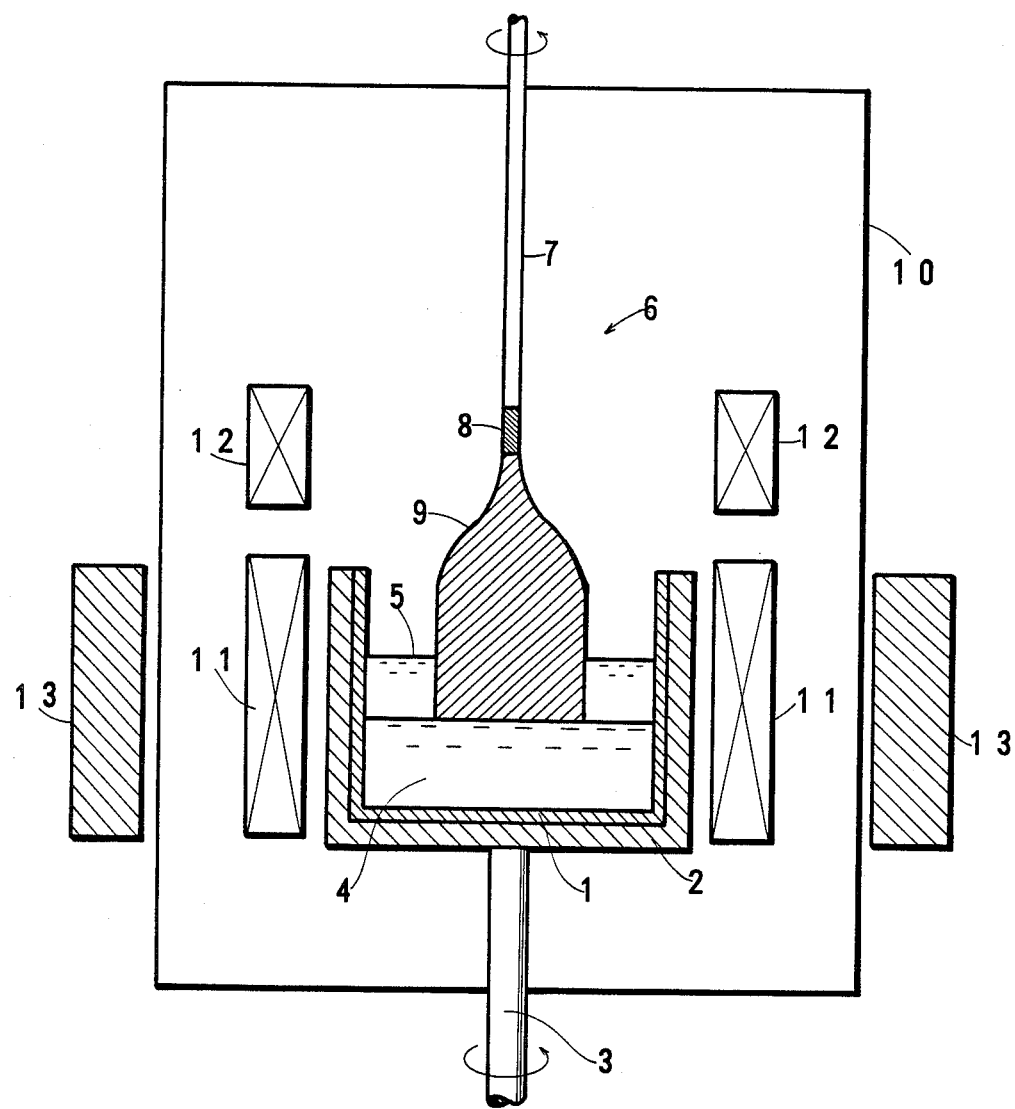
FIG. 2 is sectional view of an LEC apparatus for growing a single crystal.

FIG. 2 is a sectional view of an LEC apparatus for growing a singal crystal.

A crucible (1) is sustained by a susceptor (2). The susceptor (2) is supported by a lower shaft (3). The lower shaft (3) can rotate and go up and down.

The crucible (1) contains a melt (4) of compound semiconductor and a liquid encapsulant (5) covering the melt (4). An inactive gas (6) pressurizes the liquid encapsulant (5) to prevent the element of group V from volatilizing out of the melt (4). Here "inactive gas" means nitrogen gas or one of the inert gases—Ar, Ne, Xr, etc.

An upper shaft (7) can rotate and go up and down. A seed crystal (8) is fixed at the bottom end of the upper shaft (7).

A pressure vessel (10) encloses these apparatuses. In this pressure vessel (10) the inactive gas can be pressurized at several atom to several tens atm.

A heater (11) is installed around the crucible (1). Another heater (12) is installed around the space above the crucible (1). The lower heater (11) melts the encapsulant material and the compound material, and keeps them in melting states. The upper heater (12) controls the cooling condition of the single crystal pulled above the crucible (1). Both heaters (11) and (12) are carbon resistor heaters.

Magnets (13) mounted around the pressure vessel (10) generate a strong magnetic field in the melt (4) in the crucible (1).

The action of the magnets (13) is to suppress the convection in the melt (4). In the melt some atoms are ionized. The ionized atoms feel the strong magnetic field generated by the magnets (13). Lorentz's forces caused by the magnetic field suppress the free motions of the ionized atoms. The ionized atomes are bound along magnetic field lines, which results in braking the convection of melt (4).

The application of magnetic field to melt in LEC methods has been already proposed. The action of the applied magnetic field is to prevent turbulences in melt and suppress the perturbation of the solid-liquid interface by braking the convection.

In this invention the magnetic field plays another role instead of reducing EPD. The magnetic field raises the temperature gradient $G_l$ in melt and suppresses the temperature change of the melt near the solid-liquid interface by weakening the convention. If $G_l$ is raised, the supercooling curve f is displaced upward in FIG. 1. The upward displacement of the supercooling curve f extends the region of non-supercooling. The effects that the magnetic field yields upon the temperature change will be explained.

Even if the pulling speed R is constant, time derivative of the height of an arbitrary point of a single crystal measured from the solid-liquid interface is not always equal to the constant R, because the height of the solid-liquid interface itself changes. This is the reason why the striations happens. Striation is one of crystal defects. Striped patterns appear on an etched surface of a crystal. This corresponds to the fluctuation of growing speed.

We think that there are two reasons why the fluctuation of the level of the solid-liquid interface occurs. One is the fluctuation of the temperature $T_b$ in time near the solid-liquid interface due to the changes of heater power and the convection mode in melt. This temperature fluctuation is written as $T_b(t)$.

Another reason is the temperature difference of the single crystal along the circular direction near the solid-liquid interface. Temperature differences in a crystal can be thought along three directions—radial direction, circular direction and axial direction.

The axial temperature difference does not have a significant effect on the occurrence of striation, because a crystal does not go upward so fast as the axial temperature difference might cause rapid temperature fluctuation. The radial temperature difference also plays a minor role for the occurrence of striation, because heat transfer along a radial direction is quite slow.

Then circular temperature difference is quickly transmitted by the relative rotation of the crystal against the crucible. The circular temperature difference can be analyzed into many harmonic modes. Although higher modes may occur, the lowest mode (first mode) of circular temperature difference is most important, because the lowest mode gives largest temperature difference.

The temperature change of an arbitrary point along the circumference is written as $\Delta T_a \sin \omega t$ in the lowest mode where $\Delta T_a$ is the amplitude and $\omega$ is the angular velocity.

After all, the time fluctuation of temperature near the solid-liquid interface is given by $$(\partial/\partial t)(T_b(t)+\Delta T_a \sin \omega t) \qquad (22)$$

The height of a single crystal measured from the solid-liquid interface increases roughly in proportion to the constant pulling speed $R_0$. However if the temperature fluctuations exist near the solid-liquid interface, the increasing rate of the height is perturbed by the fluctuations.

The solid-liquid interface is an isothermal surface. A unit temperature difference causes the level change of the solid-liquid interface by $1/G_l$, where $G_l$ is the temperature gradient in melt.

Then the effective pulling speed R(t) with fluctuation is given by $$R(t)=R_0(1/G_l)(\partial/\partial t)[T_b(t)+\Delta T_a \sin \omega t] \qquad (23)$$

where the first term $R_0$ is the constant pulling speed and the second term is the fluctuation of pulling speed due to the temperature fluctuations. Eq. (23) is written as $$R(t) = R_0\left(1 - \beta\cos\omega t - \alpha\frac{\partial T_b(t)}{\partial t}\right) \qquad (24)$$

where $\beta$ is called "rotation striation coefficient" and $\alpha$ is called "non-rotation striation coefficient". They are defined by $$\beta = (\omega \Delta T_a)/(R_0 G_l) \qquad (25)$$

$$\alpha = 1/R_0 G_l \qquad (26)$$

For a rough estimation of the coefficients, we assume the parameters as follows, for example $$R_0 = 2.78 \times 10^{-4} \text{ cm/sec} \qquad (27)$$
(equal to 10 mm/H)

$$G_l = 50° \text{ C./cm} \qquad (28)$$

$$\omega = 2.3 \text{ rad/sec} \qquad (29)$$
(equal to 22 RPM)

Then $$\beta = 165.8 \Delta T_a \qquad (30)$$

$$\alpha = 71.9$$

This estimation shows us that the striation coefficients are large va;lues in comparison with 1. Because of the large striation coefficients $\alpha$ and $\beta$, the effective pulling speed $R(t)$ is not a value similar to $R_0$. $R(t)$ can take a value a hundred times as large as $R_0$. For example, if $\partial T_b/\partial t$ is assumed to be 1° C./sec, $R(t)$ becomes about seventy times as large as $R_0$.

If a magnetic field is applied, the convection in the melt is weakened. The surface state of the melt becomes more stable and the fluctuation of the temperature near the solid-liquid interface becomes smaller, which result in the reduction of $(\partial T_b/\partial t)$.

If the effective pulling speed $R(t)$ exceeds the supercooling curve f even for a short time, the supercooling will occur. Because $(\partial T_b/\partial t)$ is a fluctuation term whose time average is zero, the supercooling condition is quickly replaced by the non-supercooling condition. If the time derivative $(\partial T_b/\partial t)$ is large, transitions between the supercooling state and the non-supercooling state will occur at high frequency, which leads to the generation of striations in the pulled single crystal.

Hence the application of magnetic field prevents the occurrence of striations by reducing the fluctuation of $T_b$ and suppressing the supercooling.

However magnetic field is not an essential requirement of this invention. This invention enables us to dispense with the magnetic field.

In the conventional method, which is not novel by itself, the single crystal is pulled up by rotating the lower shaft (3) and the upper shaft (7) from the melt (4) with a relative pulling speed R.

Instead of the constant speed, this invention changes the pulling speed.

The novel feature of this invention is to propose the time dependent pulling speed in LEC methods.

The upper limit of the pulling speed is determined by the supercooling condition. In the conventional LEC methods the probability of supercooling has been neglected. The upper limit of the pulling speed was determined from the viewpoint to reduce EPD.

As mentioned previously, EPD is the etch pit density appearing on wafers. The etch pits correspond to dislocations. The wafers made by LEC methods have high dislocation densities in general.

There are several reasons why dislocations are generated. One reason is the quick cooling of a single crystal which causes thermal stresses. To delay the cooling and to reduce the temperature gradient, the pulling speed R should be small.

Therefore conventional methods has adopted the constant pulling speed $R_0$.

As shown in FIG. 1, the constant pulling speed $R_0$ exists below the supercooling point R at g=0 and the line A-C of the constant pulling speed intersects the supercooling curve f.

The curves which show the relation between the fraction solidified g and pulling speed R is called a "pulling speed curve". From the standpoint of avoiding the occurrence of supercooling, the pulling speed curve $R(g)$ should be taken an arbitrary single-valued function contained in the triangular region OPU in FIG. 1.

However the upper limit of the pulling speed is determined by another ground such as EPD other than supercooling.

The initial pulling speed is determined by the same reason in this invention. Thus the initial pulling speed of this invention assumed to be $R_0$.

Conventional pulling speed curve is the direct line A-C suffixed with e, which reaches to the supercooling condition at the point E where impurity precipitation begins. The part of crystal with the fraction solidified of $g_1$ to 1 cannot be used as substrates of electronic devices.

This inventor was aware of the importance to avoid supercooling for the first time. The main purpose of this invention is to provide appropriate pulling speed curve or function as a function of fraction solidified g or pulling time t.

Any pulling curves which start from the point A and decrease monotonously regarding t are available. Such pulling curves reach to the supercooling condition later than $g_2$, which results in the delay of the occurrence of impurity precipitation. Thus these improved pulling curve enables us to make a single crystal which has an available part more than ones made by conventional LEC methods.

Four typical pulling curves a, b, c and d allowed by this invention are shown in FIG. 1.

The pulling curve a connecting smoothly the initial point A to the final point U corresponds to Eq. (17) or Eq. (21).

If h is determined to be equal to k, the pulling curve a will be equal to the curves obtained by moving the supercooling curve towards the ordinate.

In FIG. 1 the supercooling curve f is explicitly depicted, because it is assumed that the curve is predetermined. However the supercooling curve f is not necessarily known well.

The supercooling condition includes the phenomenological parameters k, D and $G_l$. The distribution coefficient k and the diffusion constant D are the parameters depending on the temperature and the pressure. And they cannot measure easily. Some measured values were reported.

There is a more difficult problem in determining the supercooling curve. The supercooling condition includes the temperature gradient $G_l$ in melt. This value is not always a known-parameter nor a controllable one.

Even if we can control the output powers of the heater (11) and (12) as well as the rotation speeds of the upper shaft (7) and the lower shaft (3), we cannot always control the temperature gradient $G_l$.

In these cases the simple way to determine an appropriate pulling curve which starts from the initial point A and reach to the final point U without intersecting the supercooling curve f is to choose a typical curve a with h less than or equal to k.

The pulling curve a never intersect the supercooling curve f, because the initial point A is below the point P and the parameter h is less than or equal to k.

However the pulling curve a has a disadvantage that it takes much time to pull up a whole single crystal. This disadvantage will be more easily understood by showing the curve in time-speed coordinates.

Figure 3:
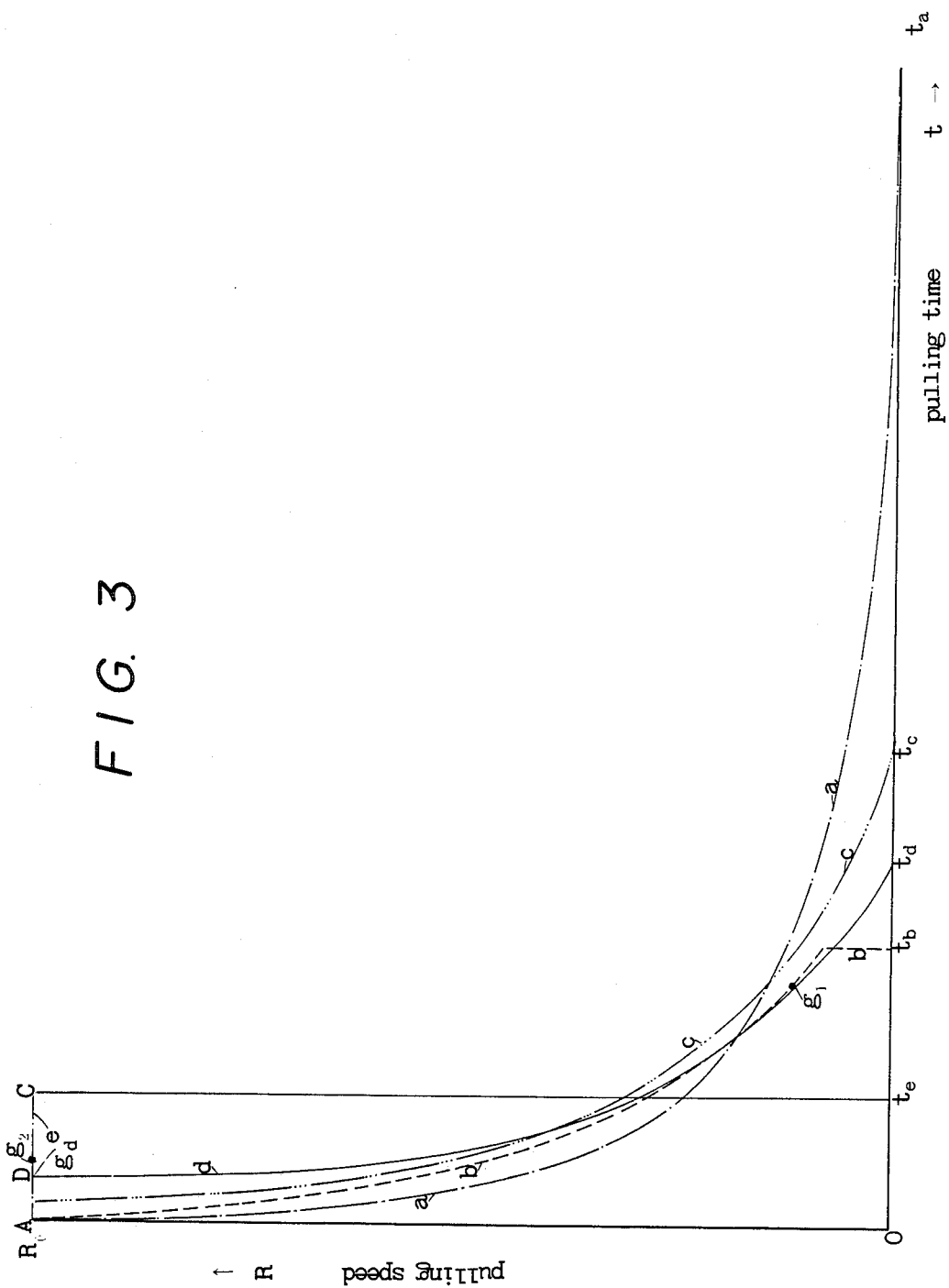
FIG. 3 is a graph showing the relations between the pulling speed R and the pulling time t which correspond to the curves depicted in FIG. 1 under the assumption of uniform diameter of single crystal.

FIG. 3 is a graph showing the relations between the pulling speed R and the pulling time.

The curve a in FIG. 3 corresponds to the curve a in FIG. 1. This curve a signifies Eq. (21). Eq. (20) shows that the pulling speed becomes very small as the solidification rate g approaches to 1. Thus the curve a has a long tail in FIG. 3. Total pulling time $t_a$ is very long.

The line AC in FIG. 3 shows a conventional pulling speed. The total pulling time $t_e$ is denoted by the length AC, which is equal to $W/(\rho SR_0)$. However the improved method will take $W/(\rho SR_0 h)$ to pull up a single crystal with a full length, because the pulling speed approaches nearly to zero in the vicinity of $g=1$. Even if the pulling operation would be ceased at a fraction solidified of 0.8 to 0.9 in practice, it would require much long time. The pulling curve a with $h=0.1$ will take ten times as long as the time $t_e$ of the constant pulling e.

Most ideal pulling speed program will be given by the curve d characterized by the points A, D and U in FIG. 1. Between the point A and the point D the pulling speed is constant ($R=R_0$).

The partial curve between the point D and the point U is determined by a equation similar to Eq. (17). This equation is obtained by replacing $R_0$ in Eq. (17) by $R_0/(1-g_d)^{1-h}$, where $g_d$ is the fraction solidified at the point D.

The time-speed curve d is shown in FIG. 3. The curve d consists of the straight line AD and the monotonously decreasing curve D $t_d$.

The pulling speed R falls quickly from the point D. Although the partial curve from D to $t_d$ has a long tail, the total pulling time $t_d$ is much shorter than $t_a$.

In the case of the curve d the most important point is to determine the turning point D.

To avoid the occurrence of supercooling, the whole curve d must lie below the supercooling curve f. If the supercooling curve f is a known curve, it is easy to determine the appropriate turning point D. It is rather difficult to determine a pertinent turning point D, because in many cases the supercooling curve f is an unknown curve.

In these cases smooth curves without a turning point at which the pulling speed R changes suddenly are more preferable than the curve d. The pulling curve c shows such an example without turning points. The pulling curve c starts from the common initial point A and decreases slowly with t. The whole pulling curve c lies below the supercooling curve f. However the total pulling time $t_c$ is longer than $t_d$. The pulling curves a, b, and c demonstrated till now give pulling speed programs immune from supercooling. These typical pulling curves converge to 0 at the limit of $g=1$.

However they have a common disadvantage that very long pulling time is required, because the pulling speeds become slow in the vicinity of $g=1$.

Another most practical way may be given by the pulling curve b in FIG. 1. The pulling curve b does not converge to the point U at $g=1$. It takes an definite positive value of R at $g=1$. The curve b in FIG. 3 show the time dependence of R. The total pulling time is $t_b$. Even at $t=t_b$ the pulling speed is not zero. This curtails the total pulling time. The total pulling time $t_b$ is shorter than $t_a$, $t_c$ or $t_d$.

Although the pulling curve b separates from the straight line A-C and begins decreasing earlier than the curve c or d, the pulling curve b will finish earlier than the curve c or d.

If the curve b is raised higher near the curve c, the total pulling time $t_b$ would be more shorter.

At the point B the pulling curve b intersects the supercooling curve f. "$g_1$" is the fraction solidified at the point B. After the intersection, the impurity precipitation will occur. The tail part of a pulled single crystal from $g=g_1$ to $g=1$ cannot be used as substrates for electronic devices because of the impurity precipitation.

The fraction solidified g at which a pulling curved intersects the supercooling curve is called "critical fraction solidified" of the pulling curve. The critical fraction solidified of the conventional pulling curve is $g_2$. The critical fraction solidified of the curve b is $g_1$. Since the curve b always exists below the conventional pulling e, $g_1$ is larger than $g_2$. The part of the crystal with the fraction solidified between $g_2$ and $g_1$ becomes good single crystal for the substrates.

Another pulling speed curve similar to the curve b is also possible. Those curves lower the pulling speed R in accordance with the curve b till a certain time and then the pulling speed is kept to be constant. Thus the pulling speed curve consists of a monotonously decreasing curve and a straight line.

This variation of the pulling curve b is based on the consideration that it is insignificant to continue lowering the pulling speed after the point B, because supercooling has already happened at the point B. It is more useful to keep the pulling speed constant after the point B. This curtails the pulling time.

But in practice the point B at which supercooling occurs is not always known prior to the pulling of a single crystal.

Thus the pulling speed is kept to be constant after some pertinent time.

Embodiments of the invention will be explained.

(1)

A GaAs single crystal of two inches in diameter was pulled up from 1.5 kg of a GaAs melt including $5.5 \times 10^{20}$ cm$^{-3}$ of In by this invention. The melt was covered with $B_2O_3$ melt—liquid encapsulant.

Initial pulling speed was 10 mm/H. The pulling speed was continuously reduced from 10 mm/H to 3 mm/H. Then the pulling speed was kept to be 3 mm/H till the end of the pulling.

In concentration was $5.5 \times 10^{19}$ cm$^{-3}$ at the top portion of the pulled single crystal.

No In precipitation exists from the top portion to the portion with $g=0.62$ (namely the partial weight of the crystal from the top portion to this portion was 930 g). Furthermore whole of these portions from $g=0$ to $g=0.62$ was a single crystal without twins or polycrystallization.

To compare this result with the conventional LEC method, the another GaAs crystal was pulled from the same melt with a constant pulling speed. The pulling speed was 10 mm/H from the beginning to the end. The pulled crystal was single-crystallized and free from impurity precipitation between g=0 and g=0.37 (the partial weight was 55 g).

This improvement enabled us to obtain an additional 375 g of good single crystal.

(2)

Under the application of a static magnetic field a GaAs single crystal was pulled from the In-doped GaAs melt according to this invention. All conditions other than the magnetic field are same as the embodiment (1). The pulling speed R was lowered from 10 mm/H to 3 mm/H. Then the 3 mm/H of pulling speed was kept till the end of the crystal growth.

The strength of the applied magnetic field was 1800 Oe at the center of the melt. The direction of the magnetic field was vertical at the melt center.

The crystal grown by the improved method was single-crystallized and free from impurity precipitation from g=0 to g=0.75 (the partial weight of the good crystal is 1125 g).

To estimate the effect of the change of the pulling speed, the another In-doped single crystal was pulled under the same magnetic field at the constant pulling speed. The pulling speed was 10 mm/H from the beginning to the end. The crystal pulled with the constant speed was free from impurity precipitation between g=0 and g=0.54 (the partial weight of the good crystal is 810 g).

Table 1 shows the upper limits of the good crystal part which is free from impurity precipitation.

TABLE 1

| | FRACTION SOLIDIFIED OF GOOD CRYSTAL PART | |
|---|---|---|
| | EMBODIMENTS 10 mm/H 3 mm/H decreasing pulling speed | CONVENTIONAL WAYS 10 mm/H constant pulling speed |
| NO MAGNETIC FIELD | 0.62 | 0.37 |
| 1800 Oe of MAGNETIC FIELD | 0.75 | 0.54 |

These results verify the consideration of this Inventors that the impurity precipitation would be generated by the occurrence of supercooling, and suppression of supercooling is effective to avoid the impurity precipitation.

This Inventors think anybody other than the Inventors has not noticed the relation between the impurity precipitation and the supercooling till now.

The advantages of this invention will be now explained.

(1)

Because the pulling speed is lowering so slowly as to avoid the occurrence of supercooling, the impurity precipitation scarecely occurs. Highly impurity doped single crystals without impurity precipitation can be obtained with a high yield.

(2)

This improvement given by this invention is only to lower the pulling speed slowly during the crystal growth. It is easy to put the improvement into practice.

Although the pulling time becomes longer, this improvement can be practised without additional cost except the cost owing to the extension of the pulling time.

(3)

Application of magnetic field will raise the effect of this invention. Lorentz's force of the magnetic field heightens the temperature gradient $G_l$ in melt by braking the convection of melt. Enhanced temperature gradient $G_l$ raises the supercooling curve in the R-g graph. Upward displacement of the supercooling curve suppresses the occurrence of impurity precipitation.

(4)

This invention has a wide scope of applications. Highly impurity doped single crystals of compound semiconductors of groups III-V such as GaAs, InP, InAs, GaP, InSb, GaSb etc., can be made by the LEC methods improved by this invention. The impurities to be doped are any elements such as In, B, Sb, Si, Ga, As and P other than the host elements.

(5)

This invention is especially useful at high impurity concentrations, because supercooling is inclined to occur under the dense existence of impurity atoms. For example, preferable impurity concentration is about $5 \times 10^{18}$ cm$^{-3}$ to $8 \times 10^{19}$ cm$^{-3}$ at the top portion of the pulled GaAs crystal.

What is claimed is:

1. A method for growing a single crystal of compound semiconductor comprising the steps of:

melting a liquid encapsulant material and compound semiconductor material doped with one or more than one impurities which have a distribution coefficient less than 1 and are selected from In, B, Sb, Si, Ga, As or P;

dipping a seed crystal into the material melt covered with the liquid encapsulant; and growing a single crystal from the melt by pulling up and rotating the seed crystal; characterized in that the pulling speed R is lowered from an initial pulling speed so as not to exceed a critical pulling speed R* during the period of substantial crystal growth, where R* is given by $$R^* = (QG_l/w_0)(1-g)^{1-k}$$

where $w_0$ is an initial gram equivalence of impurity, $G_l$ is the temperature gradient in the material melt, g is the fraction solidified to the initial material melt, k is the distribution coefficient of impurity, and Q is a constant value defined by $$Q = D/227(1-k)$$

where D is the diffusion constant of the impurity in melt, and k is the equilibrium distribution coefficient of the impurity.

2. A method for growing a single crystal as claimed in claim (1), wherein the melt is a GaAs melt, the doped impurity is In or B and the impurity concentration at the top porton of a pulled crystal is $5 \times 10^{18}$ cm$^{-3}$ to $8 \times 10^{19}$ cm$^{-3}$.

3. A method for growing a single crystal as claimed in claim 1, wherein the initial pulling speed is 1 to 5 mm/H.

4. A method for growing a single crystal as claimed in claim (1), wherein as a function of fraction solidified g, the pulling speed R is given by $$R = R_0(1-g)^{1-h}$$

where $R_0$ is an initial pulling speed, h is a positive constant less than 1 and g is a fraction solidified which is a quotient of the weight of the solidified part divided by the initial weight of melt.

5. A method for growing a single crystal as claimed in claim (1), wherein a magnetic field is applied to the melt during the growth.

* * * * *

UNITED STATES PATENT AND TRADEMARK OFFICE
CERTIFICATE OF CORRECTION

PATENT NO. : 4,783,235

DATED : November 8, 1988

INVENTOR(S) : Mikio MORIOKA; Atsushi SHIMIZU

It is certified that error appears in the above-identified patent and that said Letters Patent is hereby corrected as shown below:

IN THE SPECIFICATION:

Column 5, line 43, change " $R \leqq QG_\ell w_0 (1-g)^{1-k}$ " to -- $R \leqq QG_\ell / w_0 (1-g)^{1-k}$ --;

line 65, change " $\dfrac{\rho S}{W} \quad {}^t_0 \, Rdt = g$ " to -- $\dfrac{\rho S}{W} \int_0^t R \, dt = g$ --.

Signed and Sealed this

Sixth Day of June, 1989

Attest:

DONALD J. QUIGG

Attesting Officer

Commissioner of Patents and Trademarks